United States Patent [19]

Jacobi et al.

[11]  4,246,534
[45]  Jan. 20, 1981

[54] CALIBRATION METHOD FOR LUMPED CAPACITANCE MEASUREMENT OF COMPLEX PERMITTIVITY AT HF, VHF AND UHF FREQUENCIES

[75] Inventors: John H. Jacobi, Bowie; Lawrence E. Larsen, Silver Spring, both of Md.

[73] Assignee: The United States of America as represented by the Secretary of the Army, Washington, D.C.

[21] Appl. No.: 938,570

[22] Filed: Aug. 31, 1978

[51] Int. Cl.$^3$ .................. G01R 27/26; G01R 1/38; G01R 35/00
[52] U.S. Cl. ............... 324/57 R; 324/61 R; 324/74; 324/130
[58] Field of Search ............ 324/57 R, 60 R, 74, 324/130, 60 C, 61 R, 61 P; 364/571

[56] References Cited

PUBLICATIONS

Hyde, P. J., "Wide Frequency Range . . . ;" Proc. of the IEE; vol. 117, No. 9; Sep. 1970; pp. 1891–1901.

Hewlett-Packard Catalog; 1970; pp. 386–388; Hewlett-Packard Co., Palo Alto, Calif.

*Primary Examiner*—Ernest F. Karlsen
*Attorney, Agent, or Firm*—William G. Gapcynski; Sherman D. Winters; Werten F. W. Bellamy

[57] ABSTRACT

A rapid and accurate method for calibrating an instrument for measuring the reflection coefficient and complex permittivity of unknown dielectric materials in a lumped capacitance method for an automatic network analyzer is described. The method includes the discovery that the capacitance of the instrument filled with air can be calculated by measuring only the reflection coefficients of the instrument filled with air and filled with a standard liquid of known permittivity, without the necessity of calculating the capacitance value from the dimensions of the instrument. The complex permittivity of the unknown can then be calculated by measuring the reflection coefficient of the instrument filled with the unknown dielectric. Complex permittivity measurements are useful in, for example, evaluating the time course of dielectric dispersions in biological samples.

8 Claims, 5 Drawing Figures

CALIBRATION METHOD FOR LUMPED CAPACITANCE MEASUREMENT OF COMPLEX PERMITTIVITY AT HF, VHF AND UHF FREQUENCIES

BACKGROUND OF THE INVENTION

This invention relates to a new calibration method useful in lumped capacitance measurement of complex permittivity at HF, VHF and UHF frequencies, and in particular to a rapid and accurate method for calibrating an instrument for measuring reflection coefficients to calculate complex permittivity of dielectric materials.

The use of lumped capacitors for measurement of permittivity is not a new technique. The method has been employed at frequencies from direct current to as high as 4,000 MHz with very satisfactory results. The technique is inherently broadband because it does not depend upon resonant structures or propagation in frequency selective devices such as waveguides. The method when combined with computer controlled network analysis provides a powerful tool for studying the time course of dielectric dispersion in biological samples. This invention is related to U.S. patent application Ser. No. 938,625 entitled "*An Electromagnetic Method for Non-invasive Analysis of Cell Membrane Physiology and Pharmacology*" by L. E. Larsen, and John H. Jacobi, filed in the U.S. Patent and Trademark Office on even date herewith.

In the case of the lumped capacitance method, it is necessary to determine the admittance of the capacitor when filled with air and the complex propagation constant of the transmission line between the input connector and the sample holder in order to calibrate the instrument. The prior method for determining these constants involved calculating the capacitance value for the sample holder by measuring its dimensions, and determining the transmission line characteristics by removing the capacitor and replacing it with a standard of known reflection coefficient, typically a short.

By utilizing the calibration technique of this invention however the design or dimensions of the chamber, with the exception of its maximum dimension as will be subsequently explained, are not important and need not be measured. Therefore, the calibration technique of this invention allows great flexibility in design of the capacitance chamber. In addition, the full calibration can be completed in less than two minutes time. Therefore bad connectors or leaks in the chamber may be detected before embarking upon the experiment. Finally, bias errors in measurement of the phase of the sample holder reflection coefficient are canceled out in the calibration calculations according to the method of this invention. Accordingly, only relative phase measurements are necessary.

SUMMARY OF THE INVENTION

Accordingly, it is an object of this invention to provide a rapid and accurate method for calibrating an instrument for measuring complex permittivity of dielectric materials in HF, UHF and VHF bands.

It is another object to provide a method for calibrating an instrument for lumped capacitance method of measuring complex permittivities with an automatic network analyzer.

It is yet another object of this invention to provide a method for calibrating an instrument for measuring complex permittivity with the lumped capacitance mode without measuring the dimensions of the sample holder capacitor and without measuring the complex propagation constant of the transmission line between the input connector and the sample holder.

These and other objects will be readily apparent with reference to the drawings and following description.

DESCRIPTION OF THE DRAWINGS

The attached drawings are illustrative of typical embodiments of this invention.

DESCRIPTION OF THE INVENTION

This invention embraces a method for calibrating an instrument for measuring complex permittivity of ionic or nonionic type solutions using polarizable and/or nonpolarizable electrode surfaces. More particularly, the process of this invention is directed to a method for calibrating an instrument for measuring complex permittivity of unknown dielectrics at frequencies in the HF, VHF and UHF bands comprising: measuring the complex reflection coefficient by the lumped capacitance method in an automatic network analyzer for a capacitor terminal filled with air; measuring the complex reflection coefficient for said capacitor filled with a dielectric material of known complex permittivity; and calculating the capacitance for the air-filled capacitor and the line attenuation and propagation constants from said measurement whereby measurement of the complex reflection coefficient of the unknown dielectric may be used to calculate the complex permittivity at frequencies in said bands wherein the maxium dimension of the capacitor is less than 1% of a wavelength in said unknown dielectric material.

The method of this invention is especially designed to provide a process for calibrating an instrument for measuring complex permittivity of ionic type solutions at frequencies in the HF and VHF bands between 1 and 100 megahertz using polarizable electrode surfaces comprising the steps of: (1) measuring the complex reflection coefficient by the lumped capacitance method in an automatic network analyzer for a capacitor terminal filled with air; (2) measuring the complex reflection coefficient for said capacitor filled with a dielectric material of known complex permittivity; (3) calculating the capacitance for the air-filled capacitor and the line attenuation and propagation constants from said measurement; (4) measuring the complex permittivity of the solution with platinum/platinum black electrode surfaces; (5) measuring the complex permittivity of the solution with untreated electrode surfaces; (6) comparing the differences in complex permittivity between the measurements obtained in steps (4) and (5); (7) using the difference in complex permittivity obtained in step (6) as the correction factor; (8) applying the correction factor obtained in step (7) to the complex permittivity obtained when using polarizable electrode surfaces; and (9) using the measurement of the complex reflection coefficient of the unknown dielectric to calculate the complex permittivity at frequencies in said bands wherein the maximum dimension of the capacitor is less than 1% of a wavelength in said unknown dielectric material. Moreover, we have found it highly desirable to use polarizable electrodes which have copper or platinum surfaces.

Figure 1:
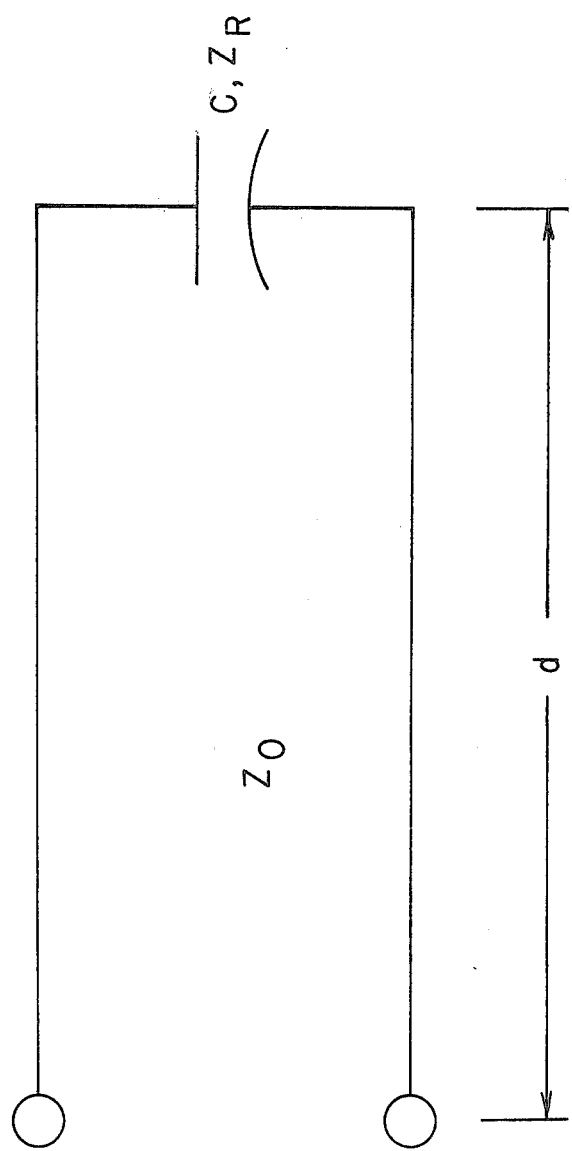
FIG. 1 is a schematic of a transmission line with capacitor.

In theory, when a capacitor is filled with a dielectric material, its new admittance bears an analytical relationship to its air filled admittance. Therefore, in principle, all that is needed to measure the permittivity of a material is a capacitor whose air-filled capacitance is known. However, prior methods for calculating the air-filled capacitance required physical measurement of the area of the capacitor plates, and the distance between the plates. Accordingly, in the case of a coaxial capacitor, the calculation could be quite time consuming. In addition, the prior techniques require measurement of the complex propagation constant of the transmission line between the input connector and the sample holder. However, considering a transmission line that is terminated in an air-filled capacitor as shown in FIG. 1, the reflection coefficient of such line as measured at the sending end is given by the following equation:

$$k_s = \frac{Z_R - Z_O}{Z_R + Z_O} e^{-2\gamma d} \quad (1)$$

wherein $k_s$ is the reflection coefficient of the air-filled capacitor, $Z_R$ is the characteristic impedance of the load,
$Z_O$ is the characteristic impedance of the line,
d is the length of the line, and
$\gamma$ is the propagation constant of the line.

If $\gamma$, d, and $Z_O$ are known, and $k_s$ is measured, then $Z_R$ can be calculated, and as will be subsequently explained, the capacitance of the air-filled capacitor ($C_O$) determined. The capacitor can then be filled with the unknown dielectric, and a new value of reflection coefficient measured. As will be subsequently explained, the unknown permittivity can then be calculated. Unfortunately, with practical sample holders which include connectors and short lengths of transmission lines $e^{-2\gamma d}$ is not always known. There is a very simple way to measure $e^{-2\gamma d}$, however, if a standard material with known permittivity is available.

If the terminating capacitor is filled with the material whose permittivity is known and the new sending end reflection coefficient is measured, the following formula will apply:

$$k_s' = \frac{Z_R' - Z_O}{Z_R' + Z_O} e^{-2\gamma d} \quad (2)$$

wherein
$k_s'$ is a reflection coefficient of the standard,
$Z_R'$ is the characteristic impedance of the capacitor filled with dielectric.
It is then known that:

$$Z_R' = Z_R/\epsilon_s^* \quad (3)$$

wherein $\epsilon_s^*$ is the complex relative permittivity of the standard material.

If the ratio of the reflection coefficients $k_s$ and $k_s'$ is calculated, the ratio K will appear as follows:

$$K = \frac{k_s}{k_s'} = \left(\frac{Z_R - Z_O}{Z_R + Z_O}\right) \left(\frac{Z_R/\epsilon_s^* + Z_O}{Z_R/\epsilon_s^* - Z_O}\right) \quad (4)$$

Since the transmission line length and attenuation have not changed between the two measurements $e^{-2\gamma d}$ has not changed and thus drops out of the equation for the ratio. Since $Z_O$ is known from the geometry of the line, and $\epsilon_s^*$ is also known, and K is the ratio of two measured numbers, only one unknown, $Z_R$, exists. Equation (4) can then be solved for $Z_R$ as follows:

$$Z_R = \frac{Z_O}{2} \left\{ \frac{(1 - \epsilon_s^*)(1 + K)}{(1 - K)} \pm \sqrt{\left[\frac{(1 - \epsilon_s^*)(1 + K)}{(1 - K)}\right]^2 - 4\epsilon_s^*} \right\} \quad (5)$$

Because of the radical, two possible values of $Z_R$ will result. Both values must be calculated and a selection must be made. In the case of the experiments subsequently reported, one value of $Z_R$ was a large inductive reactance which was clearly a physical impossibility. Once $Z_R$ has been calculated then $e^{-2\gamma d}$ can be calculated from equation (1) as follows:

$$e^{-2\gamma d} = k_s \left[\frac{Z_R + Z_O}{Z_R - Z_O}\right] \quad (6)$$

Accordingly, the above procedure by measuring only the reflection coefficient for the air-filled capacitor, $k_s$, and the reflection coefficient for the capacitor filled with a substance of known permittivity $k_s'$ permits an experimental determination of the transmission line length and attenuation between the connector on the sample holder and the capacitor.

Accordingly, for any unknown material filling the capacitor the terminating admittance $Y_{RU}$ may be calculated from the following equation:

$$Y_{RU} = \frac{1}{Z_O} \left[\frac{e^{-2\gamma d} - k_s''}{e^{-2\gamma d} + k_s''}\right] \quad (7)$$

where $k_s''$ equals the sending end reflection coefficient with the capacitor filled with the unknown substance.

The terminating admittance can also be expressed by the following equation:

$$Y_{RU} = C_O[\omega\epsilon_R'' + j\omega\epsilon_R'] \quad (8)$$

The value of $C_O$ is derived by the following relationship:

$$C_O = \frac{1}{\omega Z_R} \quad (8a)$$

, or

-continued
$$Z_R = \frac{1}{\omega C_O} \qquad (8b)$$

By equating the real and imaginary parts of equations (7) and (8) above, the following equations are obtained:

$$\epsilon'_{RU} = \frac{1}{\omega C_O} Im\{Y_{RU}\} \qquad (9)$$

$$\epsilon''_{RU} = \frac{1}{\omega C_O} Re\{Y_{RU}\} \qquad (10)$$

wherein
$\epsilon'_{RU}$ is the real part of the complex permittivity for the unknown substance,
$\epsilon''_{RU}$ is the imaginary part of the complex permittivity, and
$C_O$ is the capacitance of the air-filled capacitor.

As is well known, the complex permittivity of the unknown, $\epsilon^*_{RU}$ is expressed according to the following formula:

$$\epsilon^*_{RU} = \epsilon'_{RU} - j\epsilon''_{RU} \qquad (11)$$

where j equals the square root of $-1$.

As will be obvious from the foregoing, the value $\epsilon^*$ is a complex number relative to the permittivity of the dielectric material as compared to the permittivity of a vacuum. As is well known, the dielectric constant of the dielectric material is a function of the real part of the complex permittivity $\epsilon'_{RU}$. Conductivity or the loss tangent is a function of the imaginary part of the complex permittivity $\epsilon''_{RU}$. Accordingly, by merely measuring the reflection coefficient of the air-filled capacitor, the reflection coefficient of the capacitor filled with a standard of known permittivity, and the reflection coefficient of the capacitor filled with an unknown dielectric, the complex permittivity of the dielectric, and the dielectric constant and conductivity or loss tangent may be calculated and evaluated in response to changes in frequency.

As described in our aforementioned U.S. patent application entitled "An Electromagnetic Method for Noninvasive Analysis of Cell Membrane Physiology and Pharmacology" filed on even date herewith, the disclosure of which is hereby incorporated by reference, the complex permittivities may be utilized to evaluate cell-membrane samples, and the dispersion and conductivity has been found to represent the ion permeability barrier functions of the cell membrane.

Calibration steps also included the use of platinum/platinum black electrode coating to evaluate polarization effects at the electrode-electrolyte interface. See Schwan, H. P., *Physical Techniques in Biological Research*, Vol. VI B, Chapter 6, Academic Press, New York, 1963. Other surface treatments tested were polished copper and bright platinum. Bright platinum (about 100 microinches) over the copper with an intermediate layer of Watts nickel (around 100 to 200 microinches) over the original copper surface. Platinum black was produced according to the well know method wherein 2% lead acetate is added to a platinum salt solution. The thickness of the platinum black over the platinum plate was determined by the tables in Jones and Bollinger, "Measurement of Conductivity of Electrolytes: VIII. On Platinization," *J. Am. Chem. Soc.*, 57:281-284, 1936 (around 50-200 coulombs). The underlying platinum plating was roughened by etching in order to maximize surface area for greatest polarization capacitance and minimal polarization resistance. All plating solutions were obtained from the Electrometalics Division of Englehard Industries, Union, N.J.

The error introduced by polarizable electrodes is in the order of 6% for conductivity and a maximum of 10% for dielectric constant at the lower limiting frequency of 1 MHz. The effect of a polarizable electrode-electrolyte interface is to insert a polarization impedance in series with the sample impedance. As a result, the effect is reproducible for a given set of ionic conditions and suitable for a frequency dependent correction factor. The reason for correction rather than use of the platinum black surface treatment throughout was the difficulty in obtaining reproducible platinum/platinum black coatings, the short time such coating remained stable and most importantly the very lengthy equilibration times required for this surface. Furthermore, the platinum/platinum black system is markedly pH dependent.

Accordingly, cell membrane characteristics may be evaluated rapidly and accurately merely by utilizing the calibration technique of the instant invention.

Figure 2:
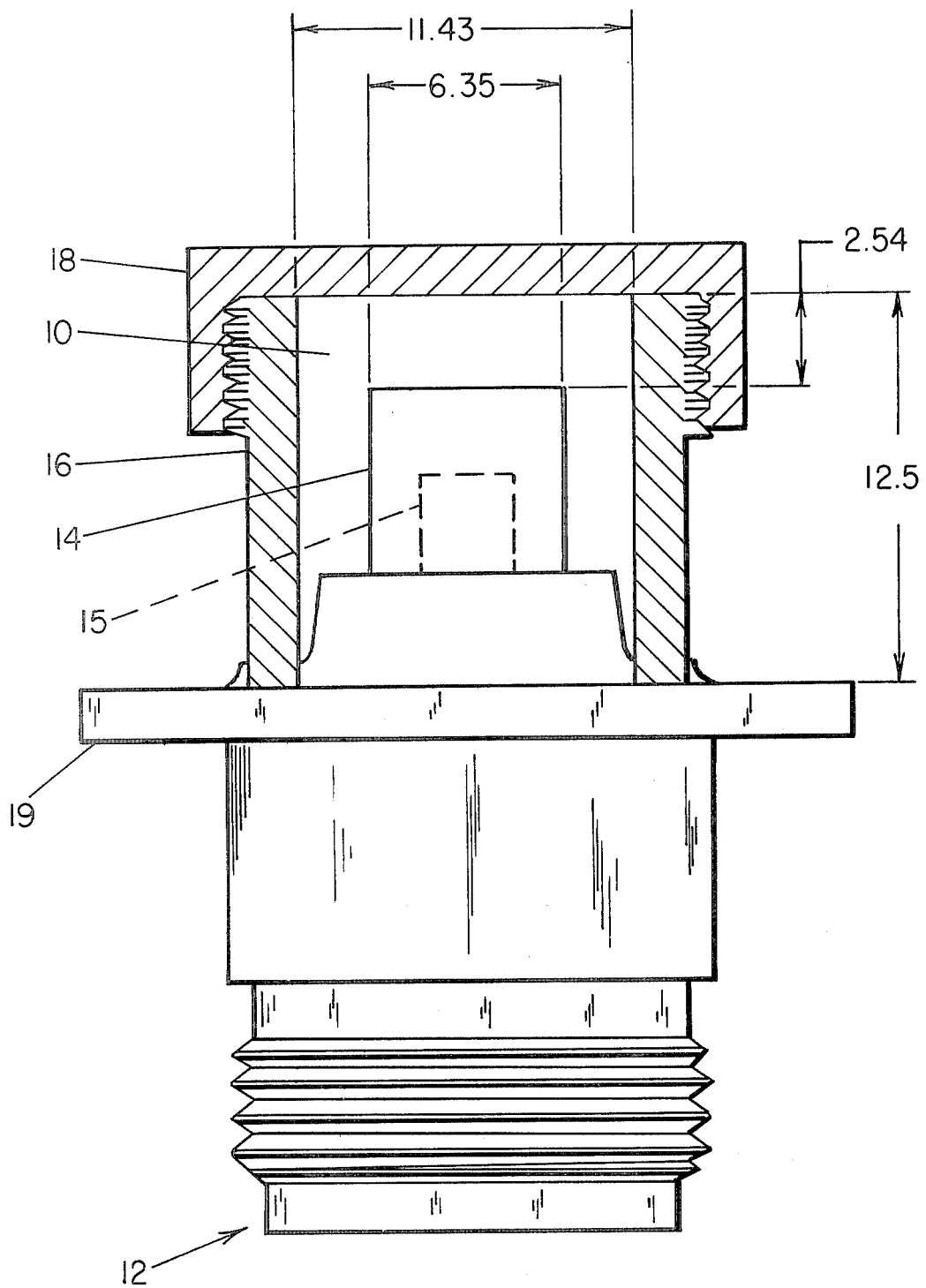
FIG. 2 is a view of the preferred capacitor-sample holder in partial cross-section.

With attention to FIG. 2, a preferred chamber utilized in testing the procedure of this invention includes a coaxial chamber 10 fabricated from a male type N bulkhead connector 12 also referred to as a UG/58 Type N panel receptacle. A center conductor 14 was fabricated and press-fitted on the center conductor solder pot 15. A copper cylinder 16 was threaded to receive a cap 18 and soldered to flange 19. The shell 16 and cap 18 form the other conductor. The dimensions of the capacitance chamber are shown in FIG. 2 in millimeters. The capacitance of this device was found to be approximately 0.83 picofarads, when filled with air.

Figure 3:
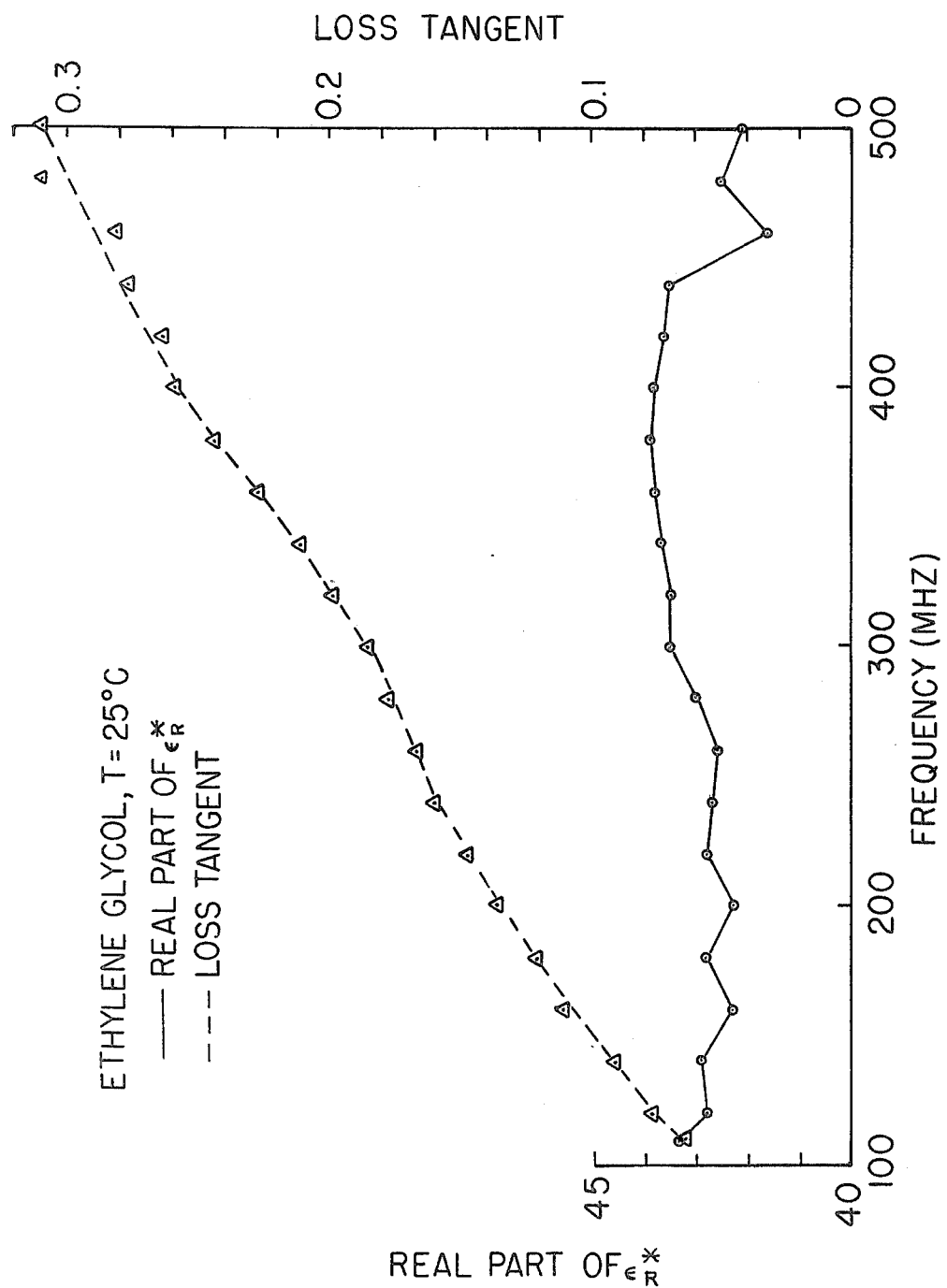
FIG. 3 is a graph of the dielectric constant and loss tangent of ethylene glycol at a temperature of 25° C. over a frequency band of from 110 to 500 MHz.
Figure 4:
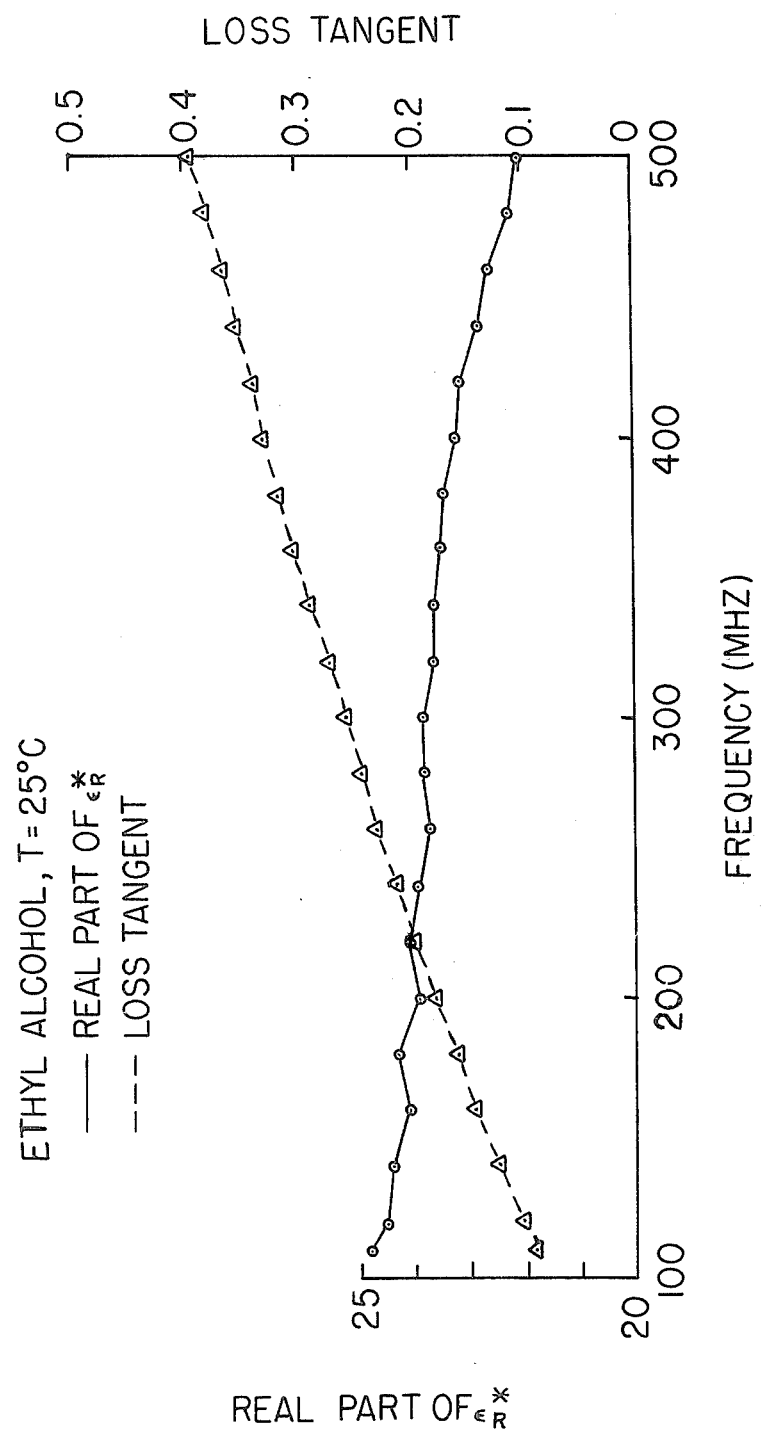
FIG. 4 is a plot similar to FIG. 3 relating to ethyl alcohol.
Figure 5:
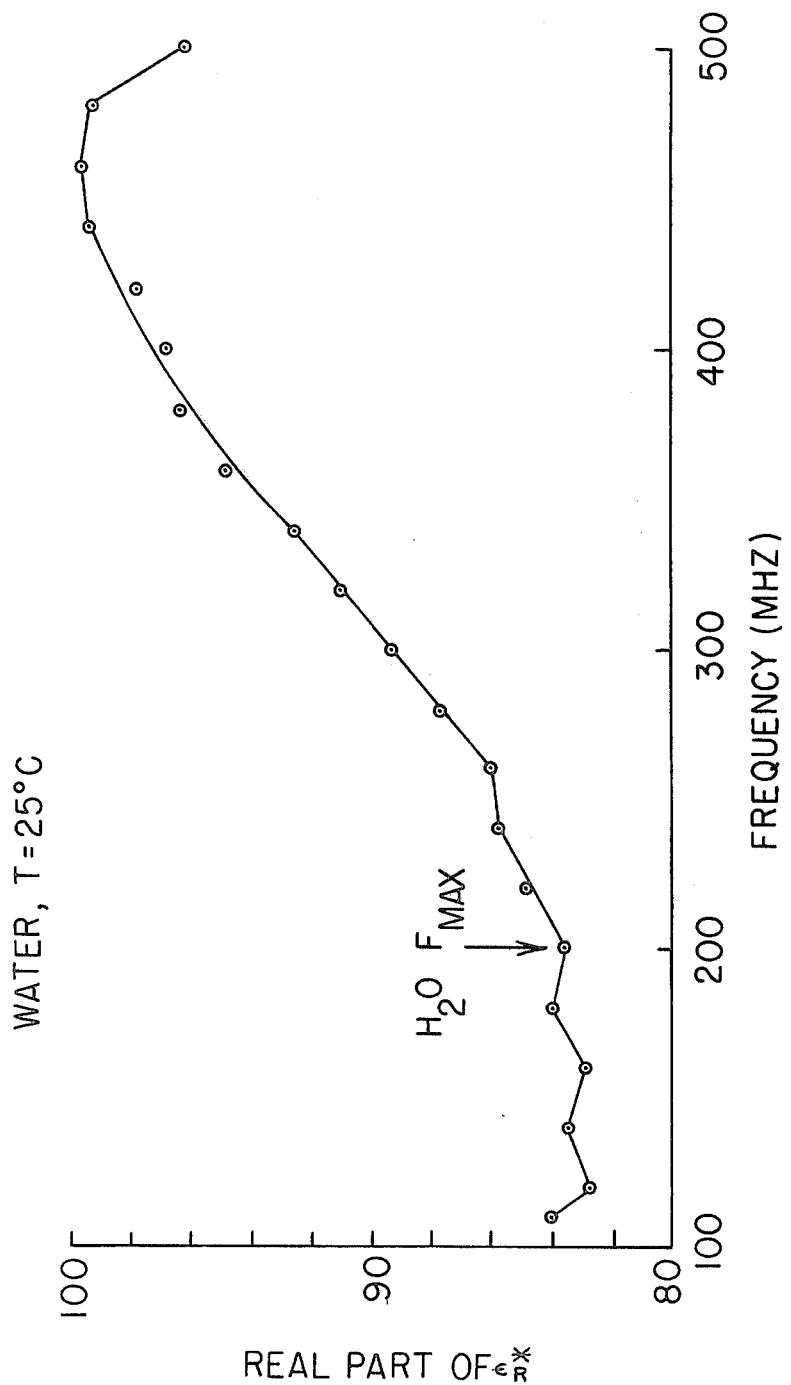
FIG. 5 is a plot of the dielectric constant of water at 25° C. over a frequency of from 110 to 500 MHz.

The reflection coefficients for the air-filled chamber and for chambers filled with ethylene glycol, ethyl alcohol, and water were measured using a Hewlett Packard 8542A Automatic Microwave Network Analyzer over the range of from 110 to 500 MHz. Carbon tetrachloride was chosen as the standard for calibration. The permittivity of carbon tetrachloride is well documented in the literature. Ethylene glycol, ethyl alcohol, and water were then evaluated as "unknowns," and the results are shown in FIGS. 3-5.

At 110 MHz the measured values of the real part of the permittivity are reasonably close to published values. For example, the result of ethyl alcohol is 5.5% high, ethylene glycol is 5.6% high, and water is 7.8% high. As frequency is increased, the accuracy of the measurement decreases. For example, with reference to FIG. 5, a sudden rise in the real part of the permittivity beginning at 200 MHz was found. This is attributed to the fact that the dielectric loading of the capacitance chamber increased its electrical size so that it can no longer be considered a lumped element above this frequency. In other words, the capacitor ceased to function as a capacitor and instead functioned as a dielectric load on the transmission line. The calibration method of this invention, is limited to the lumped element method, and therefore, is frequency limited.

It has been determined that the maximum dimension of the capacitance chamber should be less than 1% of a wavelength in the medium being measured. With this dimensional limitation, the capacitor will function as a lumped element.

In summary, then the method of the instant invention provides a rapid and accurate means for calibrating an instrument for lumped element capacitance measuremet of complex permittivity. The method of this invention is limited to a maximum dimension of the capacitor which does not exceed 1% of a wavelength in the medium being measured, and to the HF, VHF and UHF frequency bands. However, with the foregoing limitations, the method of this invention provides an accurate means for quickly evaluating the capacitance of the air-filled capacitor and the complex propagation constant of the transmission line so that the complex permittivity of an unknown may be calculated merely by measuring the reflection coefficient in an automatic network analyzer.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced herein.

What is claimed and desired to be secured by U.S. Letters Patent is:

1. Method for calibrating a sample holder and its transmission line used in conjunction with a network analyzer for measuring complex permittivity of unknown dielectrics placed in the sample holder at frequencies in the HF, VHF and UHF bands comprising:
    a. measuring the complex reflection coefficient of the sample holder by an automatic network analyzer for a sample holder filled with air;
    b. measuring the complex reflection coefficient of the sampler holder and its transmission line for said sample holder filled with a dielectric material of known complex permittivity; and
    c. calculating the capacitance for the air-filled sample holder and the line attenuation and propagation constants of the transmission line from said measurement whereby measurement of the complex reflection coefficient of the sample holder and the transmission line for the sample holder filled with unknown dielectric may be used to calculate the complex permittivity of materials placed in the sample holder at frequencies in said bands wherein the maximum dimensions of the sample holder is less than 1% of a wavelength in said unknown dielectric material.

2. The method of claim 1 wherein the dielectric material of known permittivity is water or carbon tetrachloride.

3. The method of claim 1 wherein the capacitance of the air-filled sample holder is about 0.83 picofarads.

4. The method of claim 1 wherein the complex permittivity is in the range of about 2 to 80 MHz and the maximum frequency varies inversely proportional thereto in the range from 500 to 200 MHz.

5. The method of claim 1 wherein the frequency does not exceed 200 MHz for water dominated dielectrics as shown in FIG. 5.

6. Method for calibrating an instrument for measuring complex permittivity of ionic type solutions at frequencies in the HF and VHF bands between 1 and 100 megahertz using polarizable electrode surfaces comprising the steps of:
    a. measuring the complex reflection coefficient by the lumped capacitance method in an automatic network analyzer for a capacitor terminal filled with air;
    b. measuring the complex reflection coefficient for said capacitor filled with a dielectric material of known complex permittivity;
    c. calculating the capacitance for the air-filled capacitor and the line attenuation and propagation constants from said measurement;
    d. measuring the complex permittivity of the solution with platinum/platinum black electrode surfaces;
    e. measuring the complex permittivity of the solution with untreated electrode surfaces;
    f. comparing the differences in complex permittivity between the measurements obtained in steps (d) and (e);
    g. using the difference in complex permittivity obtained in step (f) as the correction factor;
    h. applying the corrector factor obtained in step (g) to the complex permittivity obtained when using polarizable electrode surfaces; and
    i. using the measurement of the complex reflection coefficient of the unknown dielectric to calculate the complex permittivity at frequencies in said bands wherein the maximum dimension of the capacitor is less than 1% of a wavelength in said unknown dielectric material.

7. The method of claim 6 wherein the surface of the polarizable untreated electrode is copper.

8. The method of claim 6 wherein the surface of the polarizable untreated electrode is platinum.

* * * * *